United States Patent
Nguyen et al.

(10) Patent No.: US 7,772,087 B2
(45) Date of Patent: Aug. 10, 2010

(54) METHOD OF CATASTROPHIC TRANSFER OF A THIN FILM AFTER CO-IMPLANTATION

(75) Inventors: Nguyet-Phuong Nguyen, Grenoble (FR); Ian Cayrefourcq, Saint Nazaire les Eymes (FR); Christelle Lagahe-Blanchard, Saint Joseph de Riviere (FR)

(73) Assignees: Commissariat A l'Energie Atomique, Paris (FR); S.O.I. Tec Silicon On Insulator Technologies, Bernin (FR)

( * ) Notice: Subject to any disclaimer, the term of this patent is extended or adjusted under 35 U.S.C. 154(b) by 347 days.

(21) Appl. No.: 10/975,826

(22) Filed: Oct. 28, 2004

(65) Prior Publication Data

US 2005/0148163 A1 Jul. 7, 2005

Related U.S. Application Data

(60) Provisional application No. 60/531,591, filed on Dec. 19, 2003.

(51) Int. Cl.
  H01L 21/30 (2006.01)
  H01L 21/46 (2006.01)
(52) U.S. Cl. .............. 438/458; 438/459; 257/E21.568; 257/E21.57
(58) Field of Classification Search ............... 438/458, 438/455, 459, 463, 469, FOR. 100, FOR. 106, 438/FOR. 386, FOR. 103, FOR. 108; 257/E21.12, 257/E21.319, E21.473, E21.563, E21.568, 257/E21.567, E21.57
See application file for complete search history.

(56) References Cited

U.S. PATENT DOCUMENTS 4,028,149 A 6/1977 Deines et al.

(Continued)

FOREIGN PATENT DOCUMENTS

EP 0 410 679 A1 1/1991

(Continued)

OTHER PUBLICATIONS

Agarwal et al., Efficient Production of Silicon-on-Insulator Films by Co-Implantation of He+ with H+, 1998 American Institute of Physics, vol. 72, No. 9, Mar. 2, 1998, pp. 1086-1088.*

(Continued)

*Primary Examiner*—Matthew Smith
*Assistant Examiner*—Quovaunda Jefferson
(74) *Attorney, Agent, or Firm*—Brinks Hofer Gilson & Lione

(57) ABSTRACT

The invention relates to a method of catastrophic transfer of a thin film including implanting in a source substrate a first species of ions or gas at a given depth and a second species of ions or gas, the first species being adapted to generate defects and the second species being adapted to occupy those defects. The process further includes applying a stiffener in intimate contact with the source substrate, applying a heat treatment to that source substrate, at a given temperature for a given time, so as to create, substantially at the given depth, a buried weakened zone, without initiating the thermal splitting of a thin film, and applying a localized amount of energy, for example mechanical stresses, to that source substrate so as to provoke the catastrophic splitting of a thin film, the thin film having a substantially planar face opposite to the face surface of the source substrate.

12 Claims, 1 Drawing Sheet

U.S. PATENT DOCUMENTS

| | | | |
|---|---|---|---|
| 4,254,590 A | | 3/1981 | Eisele et al. |
| 5,242,863 A | | 9/1993 | Xiang-Zheng et al. |
| 5,300,788 A | | 4/1994 | Fan et al. |
| 5,374,564 A | | 12/1994 | Bruel |
| 5,400,458 A | | 3/1995 | Rambosek |
| 5,405,802 A | | 4/1995 | Yamagata et al. |
| 5,559,043 A | | 9/1996 | Bruel |
| 5,618,739 A | * | 4/1997 | Takahashi et al. ........... 438/158 |
| 5,811,348 A | | 9/1998 | Matsushita et al. |
| 5,854,123 A | | 12/1998 | Sato et al. |
| 5,877,070 A | | 3/1999 | Goesele et al. |
| 5,909,627 A | | 6/1999 | Egloff |
| 5,920,764 A | | 7/1999 | Hanson et al. |
| 5,953,622 A | | 9/1999 | Lee et al. |
| 5,966,620 A | | 10/1999 | Sakaguchi et al. |
| 5,993,677 A | | 11/1999 | Biasse et al. |
| 5,994,207 A | * | 11/1999 | Henley et al. ............... 438/515 |
| 6,013,563 A | | 1/2000 | Henley et al. |
| 6,020,252 A | | 2/2000 | Aspar et al. |
| 6,048,411 A | | 4/2000 | Henley et al. |
| 6,054,370 A | | 4/2000 | Doyle |
| 6,071,795 A | | 6/2000 | Cheung et al. |
| 6,103,597 A | * | 8/2000 | Aspar et al. ................. 438/458 |
| 6,103,599 A | | 8/2000 | Henley et al. |
| 6,127,199 A | | 10/2000 | Inoue |
| 6,146,979 A | | 11/2000 | Henley et al. |
| 6,150,239 A | | 11/2000 | Goesele et al. |
| 6,190,998 B1 | | 2/2001 | Bruel et al. |
| 6,225,190 B1 | | 5/2001 | Bruel et al. |
| 6,225,192 B1 | | 5/2001 | Aspar et al. |
| 6,248,649 B1 | * | 6/2001 | Henley et al. ............... 438/515 |
| 6,271,101 B1 | | 8/2001 | Fukunaga |
| 6,303,468 B1 | | 10/2001 | Aspar et al. |
| 6,323,108 B1 | | 11/2001 | Kub et al. |
| 6,323,109 B1 | | 11/2001 | Okonogi |
| 6,346,458 B1 | * | 2/2002 | Bower ........................ 438/458 |
| 6,362,077 B1 | | 3/2002 | Aspar et al. |
| 6,513,564 B2 | | 2/2003 | Bryan et al. |
| 6,534,380 B1 | | 3/2003 | Yamauchi et al. |
| 6,593,212 B1 | | 7/2003 | Kub et al. |
| 6,607,969 B1 | | 8/2003 | Kub et al. |
| 6,727,549 B1 | | 4/2004 | Doyle |
| 6,756,286 B1 | | 6/2004 | Moriceau et al. |
| 6,770,507 B2 | | 8/2004 | Abe et al. |
| 6,946,365 B2 | | 9/2005 | Aspar et al. |
| 7,052,978 B2 | * | 5/2006 | Shaheen et al. ............. 438/463 |
| 7,176,108 B2 | * | 2/2007 | Cayrefourcq et al. ....... 438/458 |
| 2002/0025604 A1 | | 2/2002 | Tiwari |
| 2002/0153563 A1 | | 10/2002 | Ogura |
| 2002/0185684 A1 | | 12/2002 | Campbell et al. |
| 2003/0077885 A1 | | 4/2003 | Aspar et al. |
| 2003/0134489 A1 | | 7/2003 | Schwarzenbach et al. |
| 2003/0162367 A1 | * | 8/2003 | Roche ........................ 438/460 |
| 2003/0199105 A1 | | 10/2003 | Kub et al. |
| 2004/0144487 A1 | | 7/2004 | Martinez et al. |

FOREIGN PATENT DOCUMENTS

| | | |
|---|---|---|
| EP | 0 293 049 B1 | 9/1993 |
| EP | 0 793 263 A2 | 9/1997 |
| EP | 0 801 419 A1 | 10/1997 |
| EP | 0 807 970 A1 | 11/1997 |
| EP | 0 917 193 A1 | 5/1999 |
| EP | 0 938 129 A1 | 8/1999 |
| EP | 0 533 551 B1 | 3/2000 |
| EP | 0 902 843 B1 | 3/2000 |
| EP | 0 994 503 A1 | 4/2000 |
| EP | 0994503 A1 | 4/2000 |
| EP | 1 050 901 A2 | 11/2000 |
| EP | 0 717 437 B1 | 4/2002 |
| EP | 0 786 801 A1 | 6/2003 |
| EP | 0 767 486 B1 | 1/2004 |
| EP | 0 925 888 B1 | 11/2004 |
| EP | 1 014 452 B1 | 5/2006 |
| FR | 2 681 472 A1 | 3/1993 |
| FR | 2 748 850 A1 | 11/1997 |
| FR | 2 748 851 | 11/1997 |
| FR | 2 758 907 A1 | 7/1998 |
| FR | 2 767 416 A1 | 2/1999 |
| FR | 2 773 261 | 7/1999 |
| FR | 2 774 510 A1 | 8/1999 |
| FR | 2 781 925 A1 | 2/2000 |
| FR | 2 796 491 | 1/2001 |
| FR | 2 797 347 | 2/2001 |
| FR | 2 809 867 | 12/2001 |
| FR | 2 847 075 A1 | 5/2004 |
| FR | 2861497 | 4/2005 |
| JP | 62265717 | 11/1987 |
| JP | 101004013 | 1/1989 |
| JP | 07-254690 | 10/1995 |
| JP | 7-302889 | 11/1995 |
| JP | 09-213594 | 8/1997 |
| JP | 09-307719 | 11/1997 |
| JP | 11045862 | 2/1999 |
| JP | 11-87668 | 3/1999 |
| JP | 11074208 | 3/1999 |
| JP | 11-145436 | 5/1999 |
| JP | 11-233449 | 8/1999 |
| WO | WO 99/08316 | 2/1999 |
| WO | WO 99/35674 A1 | 7/1999 |
| WO | WO 99/39378 | 8/1999 |
| WO | WO 00/48238 | 8/2000 |
| WO | WO 00/63965 | 10/2000 |
| WO | WO 01/11930 A2 | 2/2001 |
| WO | WO 02/47156 A1 | 6/2002 |
| WO | WO 02/083387 A1 | 10/2002 |
| WO | WO 03/013815 | 2/2003 |
| WO | WO 2004/044976 | 5/2004 |

OTHER PUBLICATIONS

Agarwal et al., *Efficient Production of Silicon-on-Insulator Films by Co-Implantation of He+ with H+*, 1998 American Institute of Physics, vol. 72, No. 9, Mar. 2, 1998, pp. 1086-1088.

Henttinen et al., "Mechanically Induced Si Layer Transfer in Hydrogen-Implanted Si-Wafers," 2000 American Institute of Physics, vol. 76, No. 17, Apr. 24, 2000, pp. 2370-2372.

Cerofolini et al., "Ultradense Gas Bubbles in Hydrogen- or Helium-Implanted (or Co-implanted) Silicon," *Materials Science and Engineering*, B71 (2000) Elsevier Science S.A., pp. 196-202.

Bruel et al., [vol. 99-1] Meeting Abstract No. 333, "Single-crystal semiconductor layer delamination and transfer through hydrogen implantation," *The 195th Metting of The Electrochemical Society*, May 2-6, 1999, Seattle, Washington.

Camperi-Ginestet et al., "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123-1126.

Demeester, et al., "Epitaxial Lift-off and its Applications", *Semicond. Sci. Technol.*, vol. 8, 1993, pp. 1124-1135.

DiCioccio et al., "III-V layer transfer onto silicon and applications", *Phys. Stat. Sol. (a)*, vol. 202, No. 4., 2005, pp. 509-515/DOI 10.1002/pssa. 200460411.

Feijoo et al., "Prestressing of Bonded Wafers", vol. 92-7 1992 pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Hamaguchi, et al., "Novel LSI/SOI Wafer Fabrication Using Device Layer Transfer Technique" *Proc. IEDM*, 1985, pp. 688-691.

Kucheyev et al., "Ion implantation into GaN", *Materials Science and Engineering*, 33, 2001, pp. 51-107.

Liu et al., "Ion implantation in GaN at liquid-nitrogen temperature: Structural characteristics and amorphization," *Physical Review B of The American Physical Society*, vol. 57, No. 4; 1988, pp. 2530-2535.
Moriceau et al., [vol. 99-1] Meeting Abstract No. 405, "A New Characterization Process Used to Qualify SOI Films," *The 195th Meeting of The Electrochemical Society*, May 2-6, 1999, Seattle, Washington.
Pollentier et al., "Fabrication of High-Radiance LEDs by Epitaxial Lift-off" *SPIE*, vol. 1361, 1990, pp. 1056-1062.
Suzuki et al., "High-Speed and Low Power $n^+$-$p^+$Double-Gate SOI CMOS", *IEICE Trans. Electron.*, vol. E78-C, No. 4, Apr. 1995, pp. 360-367.
Timoshenko, S., "Analysis of Bi-Metal Thermostats", *J.Opt.Soc. Am.*, 11, 1925, pp. 233-256.
Tong et al, "Low Temperature SI Layer Splitting", *Proceedings 1997 IEEE International SOI Conference*, Oct. 1997, pp. 126-127.
Wong et al., "Integration of GaN Thin Films with Dissimilar Substrate Materials by Pd-In Metal Bonding and Laser Lift-off", *Journal of Electronic Materials*, vol. 28, No. 12, 1999, pp. 1409-1413.
Yun et al., "Fractional Implantation Area Effects on Patterned Ion-Cut Silicon Layer Transfer," Dept. of Electrical Eng. And Computer Sciences, University of California, Berkeley, CA 94720, USA, 1999 IEEE International SOI Conference, Oct. 1999, p. 129-30.
Yun et al., "Thermal and Mechanical Separations of Silicon Layers from Hydrogen Pattern-Implanted Wafers," Journal of Electronic Materials, vol. No. 36, No. 8 2001.
International Search Report, PCT/FR2004/002779, Mar. 23, 2005.
International Search Report, PCT/FR2004/002781, Mar. 23, 2005.
French Search Report, FA 641570; FR 0312621, Jul. 19, 2004.
Office Action dated Jun. 22, 2009—13 pages.
U.S. District Court District of Delaware (Wilmington) Entered 07/092008 Civil Docket for Case #: 1:08-cv-00292-SLR—(11 pgs).
Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Notice of Availability of a U.S. Magistrate Judge to Exercise Jurisdiction (sns, ) (Entered: May 20, 2008) (1 pg).
Report to the Commissioner of Patents and Trademarks for Patent/Trademark Number(s) RE39,484 E; 6,809,009; 7,067,396 B2; (sns, ) (Entered: May 20, 2008) (1 pg).
Summons Returned Executed by SOITEC Silicon on Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).
Motion for Pro Hac Vice Appearance of Attorney George W. Neuner, Alan M. Spiro, Brian M. Gaff and Carolyn D'Agincourt—filed by SOITEC Silicon On Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel To Be Admitted Pro Hac Vice, # 4 Certificate of Compliance Certification by Counsel To Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 5, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon On Insulator Technologies SA. (Attachments: # 1 Certification By Counsel to be Admitted Pro Hac Vice, # 2 Certification By Counsel to be Admitted Pro Hac Vice, # 3 Certification By Counsel to be Admitted Pro Hac Vice, # 4 Certification By Counsel to be Admitted Pro Hac Vice, # 5 Certification By Counsel to be Admitted Pro Hac Vice)(Kraft, Denise) (Entered: Jun. 10, 2008) (8 pgs).
Disclosure Statement pursuant to Rule 7.1 filed by SOITEC Silicon On Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc.. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc.. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a LEnergie Atomique.Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc.. (Rogowski, Patricia) (Entered: Aug. 7, 2008) Redacted Reply Brief re 14—re 10 Motion to Dismiss Based upon or, in the Alternative, Motion for a More Definite Statement filed by MEMC Electronic Materials Inc.. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., ORDER, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson—filed by MEMC Electronic Materials Inc.. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon On Insulator Technologies SA, Commissariat a LEnergie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc..(Rogowski, Patricia) (Entered: Mar. 6, 2009) (3 pgs).
Proposed Order Proposed Scheduling Order re 16 Memorandum and Order,, Set Hearings, by SOITEC Silicon On Insulator Technologies SA, Commissariat a LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order,, 16 Memorandum and Order Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon On Insulator Technologies SA, Commissariat a LEnergie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order,, Set Hearings, by SOITEC Silicon On Insulator Technologies SA, Commissariat a LEnergie Atomique. (Kraft, Denise) (Entered: Mar. 12, 2009) (7 pgs).
Letter to The Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).

Scheduling Order: Case referred to the Magistrate Judge for the purpose of exploring ADR. Joinder of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).

Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).

Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).

Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).

Motion to Dismiss Based upon Fed. R. Civ. P. 12(b)(1) and (6) and Article III of the United States Constitution—filed by SOITEC Silicon On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).

Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon On Insulator Technologies SA, Commissariat a LEnergie Atomique.Answering Brief/Response due date per Local Rules is Apr. 27, 2009. (Attachments: # 1 Certificate of Service)(Kraft, Denise) (Entered: Apr. 7, 2009) (13 pgs).

Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon On Insulator Technologies SA, Commissariat a LEnergie Atomique. (Attachments: # 1 Certificate of Service)(Kraft, Denise) (Entered: Apr. 7, 2009) (18 pgs).

Notice of Service of First Request for Production of Documents and Things Directed to Commissariat A L'Energie Atomique; First Request for Production of Documents and Things Directed to SOITEC Silicon on Insulator Technologies, S.A. and Soitec USA, Inc.; and First Set of Interrogatories Directed to SOITEC Silicon on Insulator Technologies, S.A., Soitec USA, Inc. and Commissariat A L'Energie Atomique by MEMC Electronic Materials Inc.. (Rogowski, Patricia) (Entered: Apr. 14, 2009) (3 pgs).

Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc.. (Rogowski, Patricia) (Entered: Apr. 21, 2009) (3 pgs).

Answer to 32 Answer to Counterclaim,,, of S.O.I. TEC Silicon on Insulator Technologies, S.A. and SOITEC U.S.A., Inc. by MEMC Electronic Materials Inc..(Rogowski, Patricia) (Entered: Apr. 23, 2009) (4 pgs).

Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).

Notice of Service of Soitec's First Set of Interrogatories (Nos. 1-17) and Soitec's First Set of Requests for Production of Documents and Things (Nos. 1-132) by SOITEC Silicon On Insulator Technologies SA, Commissariat a LEnergie Atomique. (Attachments: # 1 Certificate of Service)(Kraft, Denise) (Entered: May 6, 2009) (2 pgs).

Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon On Insulator Technologies SA, Commissariat a LEnergie Atomique. (Attachments: # 1 Certificate of Service)(Kraft, Denise) (Entered: May 13, 2009).

Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered- re 38 Stipulation to Extend Time.Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).

Stipulation To Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).

Notice of Service of (1) Soitecs Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request For Production of Documents and Things by SOITEC Silicon on Insulator Technologies SA, Commissariat a LEnergie Atomique. (Attachments: # 1 Certificate of Service) (Kraft, Denise) (Entered: May 29, 2009).

Office Action (Non-Final) for U.S. Appl. No. 10/534,199-Dated Feb. 19, 2009 (8 pgs).

Office Action (Final) for U.S. Appl. No. 10/534,199-Dated Aug. 5, 2009 (10 pgs).

Office Action (Non-Final) for U.S. Appl. No. 10/534,199-Dated Jan 20, 2010 (8 pgs).

Venezia et al., "The Role of Implantation Damage in the Production of Silicon-on-Insulator Films By Co-Implantation of $He^+$ and $H^+$"., Proc. Of the English Int'l Symposium on Silicon Materials Science and Technology, Edited by H. Huff, U. Gösele, and H. Tsuya (The Electrochemical Society, Pennington, NJ 1998) Jan. 1998., (12 pgs).

* cited by examiner

METHOD OF CATASTROPHIC TRANSFER OF A THIN FILM AFTER CO-IMPLANTATION

RELATED APPLICATIONS

This application claims priority to U.S. provisional patent application Ser. No. 60/531,591, filed Dec. 19, 2003.

FIELD OF THE INVENTION

The invention relates, generally, to methods for forming a thin-film in a semiconductor substrate and, more particularly, to a method of transferring an ultra-thin film (the term thin film is also used) at low temperature by the method of co-implantation. The invention has applications in particular in the fields of micro-electronics, micro-mechanics, optics and integrated electronics.

BACKGROUND

As is known, splitting a thin film may be achieved by implantation of chemical species in a source substrate, for example of silica, to induce the formation of a zone of defects at a particular depth. These defects may be micro-bubbles and/or platelets and/or micro-cavities and/or dislocation loops and/or other crystalline defects, locally disrupting the crystalline quality of the material; their nature, density and size are strongly dependent on the species implanted (typically hydrogen) as well as on the nature of the source substrate. A heat-treatment may then be applied to enable the development of specific defects present in the weakened zone, which enables splitting of the thin film from the source substrate to be achieved later, in principle by subjecting the defects to pressure. This has in particular been described in the U.S. Pat. No. 5,374,564 and developments thereof, such as described in U.S. Pat. No. 6,020,252.

Splitting may be made, generally further to heat treatment, by applying an external force which induces fracture in the weakened zone until splitting is achieved of the thin film. When the splitting is produced at high temperature (typically near approximately 500° C.) among the technological problems encountered, mention should be made of the roughness of the surface as well as the degradation of the film transferred during the thermal splitting. This renders the treatment steps that follow more difficult. For example, the transferred film must be polished more and there is a risk of crystalline defects being created during the following treatments. Furthermore, in heterostructures (comprising a superposition of substrates of different materials), another technological problem encountered is the presence of a field of very high stresses in the various films in contact, during the heat treatment, due to the difference in the coefficients of thermal expansivity of the various materials placed in contact. This may induce the degradation of the heterostructures if the thermal splitting occurs at a temperature higher than a critical temperature. This degradation may, typically, be the breakage of one or both substrates brought into contact and/or are the unbending of the substrates at the bonding interface. This is the reason why it may be desired to achieve the splitting at lower temperature.

One way to achieve splitting at low temperature is to adjust the implantation conditions. For example, an excess dose of the implanted species may increase the weakening of the implanted zone in which the splitting at low temperature occurs. For example, Henttinen et al. showed that, if the source substrate is a wafer of silicon, a dose of hydrogen ions implanted at $1\times10^{17}$ ions/cm$^2$ (i.e., a molecular hydrogen does of $5\times10^{16}$ ions/cm$^2$), enables splitting by a mechanical force after performing the following steps: treatment, as for the target substrate, by a plasma chemical activation; cleaning of RCA1 type, bonding at ambient temperature of the source substrate onto the target substrate, and annealing at 200° C. for two hours. (K. Henttinen et al., *Applied Physics Letters*, Volume 16, Number 17, 24 Apr. 2000; pp. 2370-2372). The mechanical force utilized came from a blade inserted at the bonded interface to initiate the splitting.

This approach, although reducing the roughness of the transferred surface by of the order of half with respect to conventional splitting solutions that are purely thermal and without plasma activation, involves a step of plasma chemical activation followed by wet chemical cleaning known to those skilled in the art as RCA1 cleaning, which may represent a significant drawback from an industrial point of view, such as increased cost. Moreover, it is important to note that, due to the high implant dose of hydrogen, the heat treatment after bonding must not exceed 300° C., the temperature at which thermal splitting could occur, in which case the aforementioned advantage of the reduction in roughness of the transferred surface would not be achieved. A step of plasma chemical activation, followed by RCA1 cleaning is thus indispensable for reinforcing the bonding before its thermal consolidation according to the technique described by Henttinen et al.

It is important to note that, in fact, it is not solely the temperature of treatment which affects the later conditions of splitting of the thin film, but also the duration of that treatment, which has resulted in the concept of thermal budget, for example, as described in French patent application no. FR-2 767 416. Mechanical energy can also be provided, for example by a tool of "guillotine" type as described in PCT patent publication no. WO 02/083387.

Thus, it has been found that, if the thermal budget is too low, the transfer of the thin film is of poor quality, whereas if it is too high, fracture may occur of one of the substrates in the case of a heterostructure. It can thus be understood that in principle there exists a narrow window for the operational parameters, such as the implanted doses, the nature of the materials, the temperatures of annealing, and the like. The narrow operational parameters, however, constitute a heavy constraint for industrial exploitation.

Furthermore, the mechanical splitting often consists of introducing one or more blades from the edges of the structure, as if to "cut it out" along the weakened zone; the term 'assisted splitting' is sometimes used, since the role of the tool (such as a blade) is to propagate the fracture wave from one edge of the structure to the other.

This type of fracture leads to the following defects, at the future surface freed by the splitting of the thin film: 1) crown defect (non-transferred zone, at the periphery of the final product), for example related to a local bonding energy too low with respect to the rest of the interface, and to the introduction of tools to start off the transfer; 2) lack of uniformity (low frequency roughness) of the thickness of the thin film transferred, in particular due to the fracture wave assisted mechanically, thus irregular, by fits and starts, which then necessitates treatments, such as polishing, which it is however generally sought to avoid, 3) difficult industrial implementation, given the use of a tool which accompanies the propagation of the fracture, which implies an individual treatment of each structure (or wafer).

Most of these drawbacks are found in the case of the splitting of a thin film in a homogeneous substrate (with a single component material (SOI, for example). The splitting of the thin layer is of course also determined by the choice of the chemical species implanted.

It was indicated above that hydrogen is generally implanted, but other options have been proposed, in particular by implanting helium. A combination may even be made of two different chemical species. For example, Agarwal et al. found that implanting both hydrogen and helium enabled the total implanted dose to be reduced. (A. Argawal et al. *Applied Physics Letters*, volume 72, Number 9, 2 Mar. 1998; pp. 1086-1088). The dose effect is apparently due to the different roles played by hydrogen and helium: the hydrogen interacts with the Si—Si bonds broken by the implantation, to create Si—H bonds, resulting in a high density of platelet type defects of a size of the order of 3-10 nm (termed H-defects of platelet type), whereas helium, which does not act chemically, leads to the apparition of a lower density of larger defects (size greater than 300 nm approximately). The heat treatments envisaged by Agarwal et al. are 450° C. for 20 minutes or 750° C. for 20 seconds, which necessarily implies the drawbacks mentioned above in relation to splitting at high temperature.

This hydrogen-helium combination has also been studied, in a more theoretical manner, by Cerofolini et al., who noted that pressurization of the defects was greater with the implantation of helium than with that of hydrogen, and that the heat treatment could have different effects according to the temperature chosen. (G. F. Cerofolini et al., *Materials Science and Engineering* B71, 2000, pp. 196-202). Cerofolini et al. reported that annealing between 150° C.-250° C. leads to a reduction in the number of Si—H bonds, and annealing in the range 300° C.-450° C. leads on the contrary to an increase in that number, whereas annealing above 550° C. tends instead to reduce that number again. However, Cerofolini et al. do not deduce practical conclusions therefrom as to the manner of obtaining thin films of good quality (in particular in relation to the state of the surface) for a moderate cost.

BRIEF SUMMARY

The present invention relates to a method of transferring a thin layer leading to low roughness of the surface of the transferred layer, and not involving high mechanical stresses in case of materials having high differences in expansion coefficients. In other words, the object of the invention is to obtain, for a moderate cost, thin films of high quality, thereby avoiding at the same time the drawbacks of a heat treatment at high temperature and those related to the utilization of a tool for assisted splitting, and those related to an additional treatment for reducing roughness after splitting.

To that end the invention provides a method of catastrophic transfer of a thin film including preparing a source substrate having a face surface. The source substrate is implanted with a first species of ions or gas at a first dose at a predetermined depth with respect to a face surface of source substrate, and implanted with a second species of ions or gas at a second dose. The first species is adapted to generate defects and the second species is adapted to occupy the defects. A stiffener is applied in intimate contact with the source substrate and a heat treatment is applied to the source substrate at a predetermined temperature for a predetermined time, so as to create a buried weakened zone substantially at the predetermined depth, without initiating a thermal splitting of the thin film. A localized amount of energy is applied to the source substrate so as to provoke a catastrophic splitting of the thin film delimited between the face surface and the buried weakened layer, with respect to remaining portions of the source substrate. The thin film has a substantially planar face opposite to the face surface of the source substrate.

Catastrophic splitting may be defined here as being a complete and virtually instantaneous splitting, similar to that obtained by a simple heat treatment at high temperature, but possibly induced by a tool without it having to follow any kind of fracture wave (if there is a tool, it comes at most into contact with the substrate and the film, without following the splitting interface); this is, in other words, the contrary of an assisted splitting.

So defined, the invention is based on the implantation of two different species. One of the implanted species localizes, depending on its implantation energy, the zone in which splitting will later occur by the formation of specific defects, the other corresponds to a type of atoms trapped in that zone which will promote the extension of the specific defects designated previously, apparently: by increasing the weakening of the implanted zone at relatively low temperature by preventing, in the case of the implantation of a silicon substrate by hydrogen, the Si—H dissociation (thereby promoting the H-defects of platelet type) and putting those defects under pressure.

The heat treatment temperature is advantageously chosen so as to promote the defects of platelet type without however inducing thermal splitting. This temperature will be sufficiently low not to generate high mechanical stresses in the substrate should the source substrate and/or a possible target substrate comprise materials having very different coefficients of expansion. It is for this reason that the method is a method of transfer occurring at a relatively low temperature (no higher than 400° C. to avoid the escape of the helium, in the case of hydrogen-helium co-implantation).

It is important to note that, according to the invention, by co-implanting two gaseous species, such as hydrogen and helium, and by thermally weakening the structure at low temperature (below the aforementioned threshold of 400° C., or even below 300° C.), it has been observed that, in a completely surprising manner, the nature of the splitting is changed; weakening the implanted zone is achieved to a very high degree without generating purely thermal splitting, regardless of the annealing time (no splitting observed after 24 h of annealing at the low temperature defined above). In contrast, splitting occurs catastrophically, by simple provision of energy localized in time and in space (such as a mechanical shock at the weakened interface, for example). It would thus appear that the concept of thermal budget set out in the aforementioned French Patent Application No. FR-2 767 416 is not appropriate in the case of co-implantation with a heat treatment at low temperature in the conditions stated earlier.

The following listed consequences of this are significant:

1) the operational window of the pre-weakening annealing step is enlarged: there no longer exists (or it is considerably offset) a maximum bound for the duration of that pre-weakening annealing; this is entirely favorable to the industrialization of the method, 2) there is no longer assisted splitting since the catastrophic fracture enables the fracture wave to be propagated instantaneously and without fits and starts over the entire section of the wafer; it is not necessary for any blade whatsoever to penetrate between the substrate and the future thin film, which considerably improves the topology of the surfaces thus freed (thus with lower roughness), and avoids crown defects, which makes the entire thin film usable, including its periphery; the fact of no longer having to introduce a tool is also favorable to the industrialization of the method.

Given that, at latest at the moment of the heat treatment, the source substrate is placed in intimate contact by said face with a stiffener or target substrate, the heat treatment contributes to improving the bonding energy between those substrates.

The localized provision of energy is preferably applied in the form of a shock or pulse. It may advantageously be applied by a tool imparted with movement that is brief and of small amplitude.

It is advantageously applied in the immediate proximity of the buried layer, limited only to a part of the latter, preferably to a peripheral portion of the latter.

This provision may in particular be constituted by a localized thermal provision (for example applied by a laser pulse) or by an external force (for example in the immediate proximity of the weakened layer, at an edge of the latter).

In fact, tests with a co-implantation of hydrogen and helium in the source substrate in the conditions of the invention have lead to catastrophic splitting, that is to say to complete and virtually instantaneous splitting, with a continuous and planar propagation of the fracture wave, initiated with the help of a very low localized provision of energy, which in particular had the advantage of avoiding surface undulations, that is to say avoiding large variations in surface roughness after fracture, in comparison with progressive splitting. Due to this, that catastrophic splitting implies less polishing afterwards.

It is worth stressing that it could apparently seem difficult to define a method guaranteeing low roughness further to splitting at low temperature without plasma activation, since a low temperature would not seem to allow sufficiently solid bonding between source substrate and target substrate due to a weak bonding interface. Naturally, the method according to the invention may without detriment utilize a plasma activation of at least one of the surfaces to be placed in contact, but in contrast to the technique described in the above-referenced article by Henttinen et al., that activation is not indispensable.

Preferentially, the implantation species creating defects which promote splitting is made firstly and the implantation of the second species is made so as to localize that second species in the zone of the defects created by the first species.

Advantageously, in the case of silicon, that first species is hydrogen (preferably in the form of singly charged $H^+$ ions), which is implanted in standard concentration (typically of the order of a few $10^{16}$ ions/cm$^2$), it being recalled that hydrogen exhibits a high efficiency in creating a weakened zone. At that layer, the second species (preferably helium), playing the role of atoms trapped to promote the formation of the weakening defects, is implanted at a relatively low dose (typically of the order of $10^{16}$ ions/cm$^2$, or a few $10^{16}$ ions/cm$^2$).

When the source substrate has been bonded to the target substrate, the effect of the heat treatment at low temperature (which is nevertheless sufficient to obtain good solidity of the bonding interfaces) is that the atoms of the second helium species diffuse into the defects created by the hydrogen. The maximum weakening obtained at that relatively low temperature enables splitting to be made of an ultra-fine film which of very low roughness (of the order of a few nm), initiated by an external force.

The radical difference in this method, with respect to the technique described by above-referenced article by Henttinen et al., is that it is not necessary to carry out excess dosage of the hydrogen which can greatly damage the implanted zone. The effect of the co-implantation makes it possible to achieve the maximum weakening of that zone at the temperature sufficient for solidity of the bonding interfaces without involving additional processes (plasma chemical activation and RCA1). Furthermore, the invention leads to reduced roughness of the transferred film in comparison with that obtained by thermal splitting.

Advantageously, the second species (for example helium) is implanted at the same level as the first (hydrogen) but as a variant it may be implanted at a greater offset depth (for example) in the source substrate to reduce the zone degraded by the implantation. This offset level may be clearly distinct from the first, for example much deeper in the source substrate. In this case, it appears that a small part of the second implanted species is trapped by the defects encountered on its implantation path.

In fact, the co-implantation enables a temperature of 200° C. to 400° C. to be chosen.

Preferably, the source substrate is of a material chosen from semi-conductors and insulators, monocrystalline, polycrystalline or amorphous. Thus it may be chosen from the semi-conductors IV (a particularly attractive example is silicon but it may also be germanium or Si—Ge alloys, in particular).

At least in this case, the temperature of heat treatment is advantageously chosen in the range 200° C.-400° C., preferably in the range 300° C.-350° C., for example for a duration of a few hours (typically of the order of 2 to 5 hours). The source substrate may also be a semi-conductor material of III-V type (for example AsGa or InP) or of an insulating material preferably chosen from the group comprising LiNbO3 and LiTaO3.

The heat treatment may also have a profile adapted to reduce the time of that treatment, as is for example disclosed in European Patent Application No. 02-293049 filed on Dec. 10, 2002.

In fact, the temperature range depends principally on the nature of the species implanted and on the nature of the material constituting the source substrate.

The target substrate or stiffener is advantageously chosen in the form of an amorphous material, preferably in the form of fused silica. However, it may also be a monocrystalline or polycrystalline material, of silicon or sapphire, in particular.

BRIEF DESCRIPTION OF THE DRAWING

Aims, features and advantages of the invention will appear from the following description, given by way of non-limiting illustration with reference to the accompanying drawing in which.

DETAILED DESCRIPTION

Figure 1:
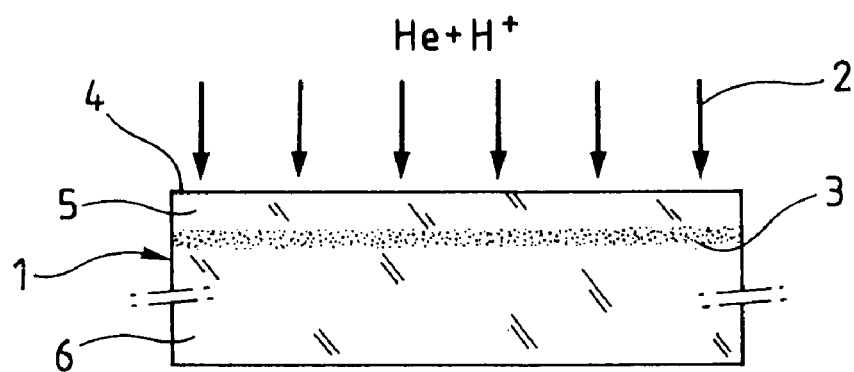
FIG. 1 is a diagram of a source substrate in course of implantation.

FIG. 1 thus shows a substrate 1, for example of silicon advantageously oxidized on its surface 4, in course of being subjected to an implantation treatment, represented by the arrows 2, for example by bombardment with ions or gaseous species.

This implantation involves, at a given depth, implantation of a first species which is adapted to generate defects, for example hydrogen, preferably in the form of $H^+$ ions, and implantation of a second species, for example helium, adapted to occupy those defects. In the case represented, both species are implanted at the same depth, but in a variant form, the second species is implanted at a depth different from the first, for example at a greater depth.

Commencement can be made by implanting the first species, i.e., hydrogen, after which helium may be implanted to occupy the defects so created. However, the inverse order of the implantations is preferred, even if the two implantations are not made at the same depth.

A buried zone 3 results from this, weakened by the presence of defects, principally generated by the first species, to the development of which the second species will contribute.

The weakened zone 3 delimits, within the source substrate, a future thin film 5 and a substrate remainder 6, that is to say that which remains of the source substrate after splitting of the thin film; this remainder will be able to serve as source substrate for an iteration of the procedure.

Figure 2:
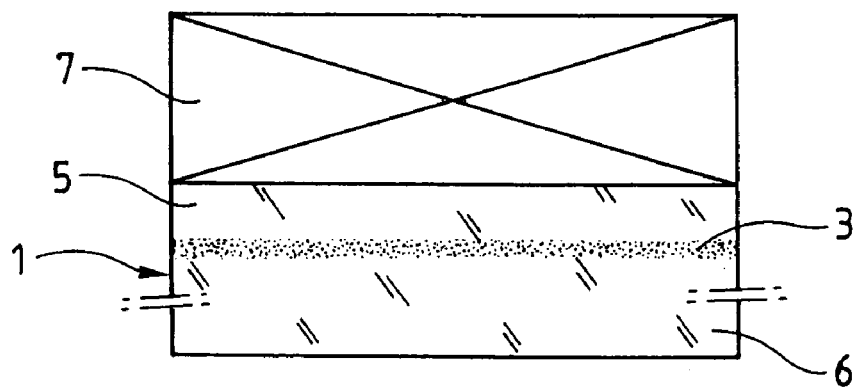
FIG. 2 is a later view of it after putting in intimate contact (bonding) with a target substrate.

FIG. 2 represents a step during the course of which the source substrate, containing the buried weakened zone 3, is placed by its face 4, into intimate contact with a corresponding face of a target substrate 7, typically by direct molecular bonding, whose function is that of a stiffener.

A heat treatment is then applied which will, on the one hand, enable development of the weakening of the buried layer 3, and on the other hand, when a bonding step has taken place, enables consolidation of the bonds between source substrate and target substrate.

More particularly, the temperature of this heat treatment is chosen from the range of temperatures suitable for developing the weakened zone, that is to say the Si—H bonds in the present case.

This treatment is advantageously carried out at a temperature chosen from the range 200° C.-400° C., preferably from the range 300° C.-350° C., for a duration typically chosen of a few hours, for example two hours. Thus, the thermal budgets (temperature-duration pairs) are industrially realistic.

Figure 3:
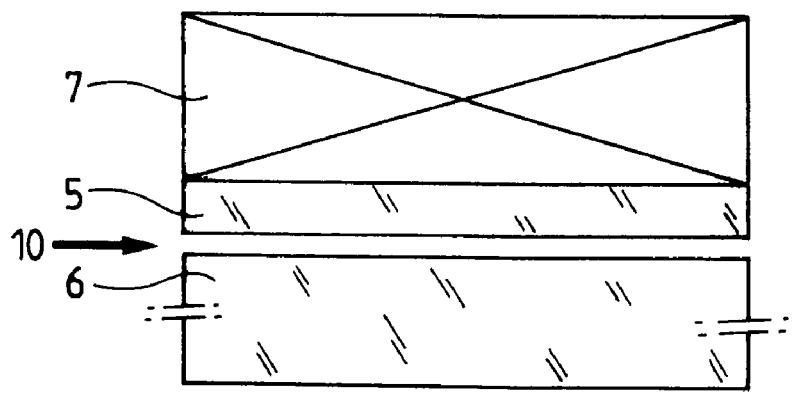
FIG. 3 is a view of it in course of splitting of a thin film deriving from the source substrate.

In FIG. 3 there is represented the step of splitting of the thin film 3 from the remainder of the source substrate, by means of the application of a local provision of energy, preferably brief and of limited amplitude, for example in the form of a shock or pulse.

It is for example constituted by a mechanical stress represented by the arrow 10.

The splitting obtained is catastrophic in the sense that, in particular, there is no movement of a tool along the weakened layer.

This local provision of energy is here limited to a part of the buried layer, represented in the form of a corner effect corresponding to a shock applied by a tool such as a blade on (or proximal to) a portion of that buried weakened layer; but it may be of any other nature, for example a couple parallel to the plane of the buried weakened layer advantageously applied in the form of a pulse of small angular amplitude. By virtue of the method of the invention, the face of the thin film which is freed by the catastrophic splitting in the buried weakened zone (in practice substantially planar) has a roughness Ra considerably less than with the conventional solutions, without it having been necessary to provide a particular treatment of the surfaces transferred nor substantial ("coarse") polishing after splitting. It is worth nothing that, since splitting is catastrophic, there is no real propagation in fits and starts of a of a fracture wave liable to generate surface waves, and that, since there is no movement of any tool along newly created surfaces (or relative movement between the two parts on each side of buried layer) there is no degradation of the surfaces thus freed, which therefore have a very smooth surface state, induced by the catastrophic splitting.

The source substrate 1 may not only be of silicon, but more generally of any appropriate known material for example a IV or III-V semiconductor, monocrystalline or polycrystalline or even amorphous. Thus the source substrate may be:

1) another semiconductor of column IV of the periodic table of the elements, for example of germanium, 2) a semiconductor of type III-V such as AsGa or InP, in particular, or 3) an insulator, for example of niobate or tantalate type, such as $LiNbO_3$ or $LiTaO_3$, in particular.

The target substrate may be of a wide variety of materials, to be chosen according to needs, monocrystalline or polycrystalline (for example semiconductors, for example from among the same materials as for the source substrate) or even be amorphous (for example types of glass, or polymers); thus it may in particular be:

1) a crystalline material such as sapphire, 2) of fused silica or of another glass, or 3) a simple stiffening layer, for example of oxide a few tens of nanometers thick, deposited by any appropriate known technique (this admittedly no longer corresponds to a bulk target substrate of the type represented in the drawings).

It is worth noting that the target substrate may be just an intermediate substrate from which the thin film is later transferred onto a final substrate.

EXAMPLES

According to a first embodiment of the invention, a substrate of Si (~700 μm) comprising a layer of thermal $SiO_2$ on the surface (for example 145 nm) was implanted initially with helium atoms under implantation conditions of 70 keV at $1\times10^{16}$ ions/cm$^2$, and then implanted with hydrogen atoms under implantation conditions of 30 keV at $4.25\times10^{16}$ ions/cm$^2$. This source substrate was next joined to a target substrate of Si (~700 μm) by direct bonding. A heat treatment around 350° C. induced the growth of cavities of platelet type localized at the hydrogen concentration peak. The helium atoms play the role of atoms trapped thereat and create a maximum of defects of platelet type at the applied temperature. After a certain time (for example 2 hours), with scarcely the commencement of insertion of a blade between the bonding interfaces in the form of a shock, catastrophic splitting at the location of maximum hydrogen concentration led to the transfer of the thin film of Si onto the target substrate. The roughness of the surface transferred measured at high frequency (by atomic force microscopy) was on the order of 45 to 50 angstroms, and at low frequency (by profilometric method), was on the order of 10 angstroms. The amorphousness of that transferred surface was substantially less than that which may be obtained in the case of H-implanted alone (32 keV at $5.5\times10^{16}$ ions/cm$^2$) followed by a heat treatment at 500° C. (for comparison: roughness at low frequency of the order of 26 angstroms and roughness at high frequency of the order of 75 angstroms).

According to another embodiment of the invention, a substrate of Si (approximately 300 μm) comprising a layer of thermal $SiO_2$ on the surface (for example 200 nm) was implanted initially with helium atoms under implantation conditions of 70 keV at $2\times10^{16}$ ions/cm$^2$, and then was implanted with hydrogen under the conditions of 30 keV at $3\times10^{16}$ ions/cm$^2$. This source substrate was then joined to a target substrate of fused silica (approximately 1000 μm) by direct bonding. A heat treatment around 300° C. induced the growth of cavities of platelet type localized at the hydrogen concentration peak. The implanted atoms of helium trapped by the hydrogen defects favored the formation of a maximum of the defects of platelet type at the applied temperature. After a certain time (5 hours for example), by means of a blade only scarcely inserted between the bonding interfaces and imparted with a movement pulse (i.e., a shock), a catastrophic splitting at the maximum of the hydrogen profile led to the transfer of the Si thin film onto the fused silica substrate. The transfer was carried out without breakage or degradation of either of the substrates derived from the heterostructure after splitting (the fused silica substrate having the thin film of Si on the one hand, and the initial Si substrate having had the superficial thin film peeled from it on the other hand). The roughness of the surface transferred, measured at low frequency by profilometric method was on the order of 14 angstroms at low frequency, and was on the order of 75 angstroms at high frequency. The amorphousness of that transferred surface was substantially less than that which may be obtained in the case of H-implanted alone (32 keV at $5.5\times10^{16}$ ions/cm$^2$) using the progressive mechanical splitting method at high temperature (for comparison: roughness at high frequency of the order of 90 angstroms and roughness at low frequency of the order of 40 angstroms).

The invention claimed is:

1. A method of catastrophic transfer of a thin film comprising:
    preparing a silicon source substrate having a face surface and a silicon oxide layer overlying the face surface;
    implanting helium in the silicon source substrate, and then implanting hydrogen at a predetermined depth with respect to a face surface of the silicon source substrate to generate defects therein, wherein hydrogen is implanted at a higher implant dose than helium, and wherein the helium occupies the defects;
    applying a target substrate in intimate contact with the silicon source substrate;
    applying a heat treatment to the source substrate at a temperature below about 400° C., so as to create a buried weakened zone comprising platelet defects substantially at a predetermined depth, without initiating a thermal splitting of the thin film from the silicon source substrate; and
    applying a localized amount of energy to only a portion of the buried weakened zone of the silicon source substrate so as to provoke splitting, at the same time, of the entire buried weakened zone of the thin film delimited between the face surface and the buried weakened layer with respect to remaining portions of the source substrate, the thin film having a substantially planar face opposite to the face surface of the source substrate with a surface roughness of no more than about 75 angstroms, as determined by high frequency atomic force microcopy.

2. The method according to claim 1, wherein applying a heat treatment comprises applying a heat treatment at a temperature in the range of about 200° C.-400° C.

3. The method according to any claim 1, wherein applying a heat treatment comprises applying a heat treatment at a temperature in the range of less than about 300° C.

4. The method according to claim 1, wherein applying a heat treatment comprises applying a heat treatment for approximately 2 hours to 5 hours.

5. The method according to claim 1, wherein implanting hydrogen comprises implantation at a dose of about $3\times10^{16}$ ions/cm$^2$ to about $4.25\times10^{16}$ ions/cm$^2$.

6. The method according to claim 1, wherein implanting helium comprises implantation at a dose of about $1.0\times10^{16}$ ions/cm$^2$, and implanting hydrogen comprises implantation at a dose of about $4.25\times10^{16}$ ions/cm$^2$.

7. The method according to claim 1, wherein applying a localized amount of energy comprises applying mechanical stress generated by physical contact with the source substrate.

8. The method according to claim 1 further comprising additional processing of the thin film in the absence of a polishing process applied to the planar face of the thin film.

9. The method according to claim 1, wherein applying a target substrate comprises applying an amorphous material.

10. The method according to claim 1, wherein applying a target substrate comprises applying a fused silica substrate.

11. The method according to claim 1, wherein applying a target substrate comprises applying one of a monocrystalline substrate or a polycrystalline substrate.

12. The method according to claim 1, wherein implanting helium comprises implantation at a dose of about $2.0\times10^{16}$ ions/cm$^2$, and implanting hydrogen comprises implantation at a dose of about $3.0\times10^{16}$ ions/cm$^2$.

* * * * *